(12) United States Patent
Sudhiranjan et al.

(10) Patent No.: US 9,190,560 B2
(45) Date of Patent: Nov. 17, 2015

(54) METHOD OF FORMING A LIGHT EMITTING DIODE STRUCTURE AND A LIGHT DIODE STRUCTURE

(75) Inventors: Tripathy Sudhiranjan, Singapore (SG); Lin Vivian Kaixin, Singapore (SG); Teo Siew Lang, Singapore (SG); Dolmanan Surani Bin, Singapore (SG)

(73) Assignee: Agency for Science Technology and Research, Singapore (SG)

( * ) Notice: Subject to any disclaimer, the term of this patent is extended or adjusted under 35 U.S.C. 154(b) by 95 days.

(21) Appl. No.: 13/698,982

(22) PCT Filed: May 18, 2010

(86) PCT No.: PCT/SG2010/000189
§ 371 (c)(1),
(2), (4) Date: Jan. 17, 2013

(87) PCT Pub. No.: WO2011/146015
PCT Pub. Date: Nov. 24, 2011

(65) Prior Publication Data
US 2013/0193466 A1    Aug. 1, 2013

(51) Int. Cl.
*H01L 33/02* (2010.01)
*H01L 33/00* (2010.01)
*H01L 33/40* (2010.01)

(52) U.S. Cl.
CPC ............ *H01L 33/025* (2013.01); *H01L 33/007* (2013.01); *H01L 33/405* (2013.01); *H01L 2933/0083* (2013.01)

(58) Field of Classification Search
None
See application file for complete search history.

(56) References Cited

U.S. PATENT DOCUMENTS

| | | |
|---|---|---|
| 5,786,606 A | 7/1998 | Nishio et al. |
| 5,919,305 A | 7/1999 | Solomon |
| 6,046,465 A | 4/2000 | Wang et al. |
| 6,071,795 A | 6/2000 | Cheung et al. |
| 6,211,095 B1 | 4/2001 | Chen et al. |
| 6,335,263 B1 | 1/2002 | Cheung et al. |
| 6,413,839 B1 | 7/2002 | Brown et al. |
| 6,420,242 B1 | 7/2002 | Cheung et al. |
| 6,531,375 B1 * | 3/2003 | Giewont et al. ............... 438/407 |

(Continued)

FOREIGN PATENT DOCUMENTS

| | | |
|---|---|---|
| CN | 101673792 | 3/2010 |
| WO | 2008057055 | 5/2008 |
| WO | 2008065373 | 6/2008 |

OTHER PUBLICATIONS

Zamir et al. ("Lateral confined epitaxy of GaN layers on Si substrates", Jour. Crystal Growth 230 (2001) 341-345) (IDS Ref) (applicant submitted this reference on Mar. 5, 2014 as an IDS).*

(Continued)

*Primary Examiner* — Whitney T Moore
*Assistant Examiner* — Scott R Wilson
(74) *Attorney, Agent, or Firm* — Conley Rose, P.C.

(57) ABSTRACT

A method of forming a vertical III-nitride based light emitting diode structure and a vertical III-nitride based light emitting diode structure can be provided. The method comprises forming a III-nitride based light emitting structure on a silicon-on-insulator (SOI) substrate; forming a metal-based electrode structure on the III-nitride based light emitting structure; and removing the SOI substrate by a layer transfer process such that the metal-based electrode structure functions as a metal-based substrate of the light emitting structure.

24 Claims, 13 Drawing Sheets

(56) References Cited

U.S. PATENT DOCUMENTS

| | | | |
|---|---|---|---|
| 6,559,075 | B1 | 5/2003 | Kelly et al. |
| 6,596,377 | B1 | 7/2003 | Hersee et al. |
| 6,602,764 | B2 | 8/2003 | Linthicum et al. |
| 6,611,002 | B2 | 8/2003 | Weeks et al. |
| 6,815,309 | B2 | 11/2004 | Letertre et al. |
| 6,849,474 | B2 | 2/2005 | Wang et al. |
| 6,867,067 | B2 | 3/2005 | Ghyselen et al. |
| 6,946,317 | B2 | 9/2005 | Faure et al. |
| 6,956,250 | B2 | 10/2005 | Borges et al. |
| 6,991,995 | B2 | 1/2006 | Aulnette et al. |
| 7,074,631 | B2 | 7/2006 | Erchak et al. |
| 7,083,993 | B2 | 8/2006 | Erchak et al. |
| 7,098,589 | B2 | 8/2006 | Erchak et al. |
| 7,135,383 | B2 | 11/2006 | Faure et al. |
| 7,186,580 | B2 | 3/2007 | Tran et al. |
| 7,195,944 | B2 | 3/2007 | Tran et al. |
| 7,217,641 | B2 | 5/2007 | Gehrke et al. |
| 7,232,488 | B2 | 6/2007 | Akatsu et al. |
| 7,247,889 | B2 | 7/2007 | Hanson et al. |
| 7,365,374 | B2 | 4/2008 | Piner et al. |
| 7,413,918 | B2 | 8/2008 | Tran et al. |
| 7,432,119 | B2 | 10/2008 | Doan |
| 7,473,936 | B2 | 1/2009 | Tran et al. |
| 7,485,482 | B2 | 2/2009 | Lee et al. |
| 7,518,153 | B2 | 4/2009 | Usuda et al. |
| 2005/0077537 | A1* | 4/2005 | Seong et al. ............ 257/103 |
| 2005/0227455 | A1 | 10/2005 | Park et al. |
| 2005/0282373 | A1 | 12/2005 | Bader et al. |
| 2006/0011925 | A1 | 1/2006 | Bader et al. |
| 2006/0043530 | A1* | 3/2006 | Ho et al. .............. 257/565 |
| 2006/0191474 | A1 | 8/2006 | Chen et al. |
| 2006/0284278 | A1 | 12/2006 | Min et al. |
| 2008/0006862 | A1 | 1/2008 | Li et al. |
| 2008/0038854 | A1 | 2/2008 | Choi et al. |
| 2008/0108171 | A1 | 5/2008 | Rogers et al. |
| 2008/0108224 | A1 | 5/2008 | Yu |
| 2008/0112448 | A1 | 5/2008 | Ueda et al. |
| 2008/0116456 | A1 | 5/2008 | Piner et al. |
| 2008/0123709 | A1 | 5/2008 | Hersee |
| 2008/0157123 | A1 | 7/2008 | Schulze et al. |
| 2008/0171424 | A1 | 7/2008 | Li et al. |
| 2008/0277285 | A1* | 11/2008 | Vereecken ............. 205/123 |
| 2009/0032799 | A1 | 2/2009 | Pan |
| 2009/0032911 | A1 | 2/2009 | Kononchuk |
| 2009/0034905 | A1 | 2/2009 | Ty Tan et al. |
| 2009/0050939 | A1 | 2/2009 | Briere |
| 2009/0078943 | A1 | 3/2009 | Ishida et al. |
| 2009/0092810 | A1 | 4/2009 | Lee et al. |
| 2009/0101924 | A1 | 4/2009 | Bhat et al. |
| 2009/0194793 | A1 | 8/2009 | Briere |
| 2009/0250739 | A1 | 10/2009 | Jonson et al. |
| 2010/0012954 | A1 | 1/2010 | Yu et al. |
| 2010/0035416 | A1 | 2/2010 | Chen et al. |
| 2010/0055818 | A1* | 3/2010 | Chen et al. ............. 438/33 |
| 2010/0059732 | A1 | 3/2010 | Chang |
| 2010/0193781 | A1* | 8/2010 | Tripathy et al. ......... 257/43 |
| 2011/0076791 | A1 | 3/2011 | Wu et al. |
| 2011/0169027 | A1* | 7/2011 | Park et al. ............. 257/98 |

OTHER PUBLICATIONS

S. Tripathy, V. K. X. Lin, S. L Teo, A. Dadgar, and A. Krost, "Reflecting layers boosts LED brightness", Compound Semiconductor, Mar. 2009.

S. Tripathy, T. E. Sale, A. Dadgar, V. K. X. Lin, K. Y. Zang, S. L. Teo, A. M. Yong, S. J. Chua, J. Biasing, and A. Krost, GaN-based microdisk light emitting diodes on (111)- oriented nanoscale silicon-on-insulator substrates:, Journal of Applied Physics, vol. 104, 053106 (2008).

S. Tripathy, V. K. Y. Lin, S. L. Teo, A. Dadgar, A. Diez, J. Biasing, and A. Krost, "IngaN/GaN light emitting diodes on nanoscale silicon on insulator", Applied Physics letters, vol. 91, 231109 (2007).

L. S. Wang, S. Tripathy, S. J. Chua, and K. Y. Zang, InGaN/GaN multi-quantum well structures on (111)-oriented bonded silicon-on-insulator substrates:, Applied Physics Letters, vol. 87, 111908 (2005).

Kawakami et. Al.: "In inhomogeneity and emission characteristics of InGaN", J. Phys.: Condens. Matter, Jul. 26, 2001, vol. 13, 6993-7010.

Bayliss et. Al.: "The optical and structural properties of InGaN epilayers with very high indium content", Materials Science and Engineering, B59 (1999), pp. 292-297.

D. Zubia, S. H. Zaidi, S. R. J. Brueck, and S. D. Hersee, Appl. Phys. Lett., vol. 76, No. 7, p. 858-860 (2000).

K. Y. Zang, Y. D. Wang, S. J. Chua, L. S. Wang, S. Tripathy, and C. V. Thompson, Appl. Phys. Lett. 88, 141925 (2006).

S. D. Hersee, X. Y. Sun, X. Wang, M. N. Fairchild, J. Liang, and J. Xu, J. Appl. Phys. 97, 124308 (2005).

D. Zubia, S. H. Zaidi, S. D. Hersee, and S. R. J. Brueck, J. Vac. Sci. Technol. 18, 3514 (2000).

Yang et al. Appl. Phys. Lett 76, 273 (2000).

H. Sato, A. Tyagi, H. Zhong, N. Fellows, R. B. Chung, M. Saito, K. Fujito, J. S. Speck, S. P. DenBaars, and S. Nakaamura, physica status solidi (RRL)—Rapid Research Letters 1, 162 (2007).

C. Wetzel, M. Zhu, J. Senawiratne, T. Detchprohm, P. D. Persans, L. Liu, E. A. Preble, and D. Hanser, J. Crystal Growth 310, 3987 (2008).

T. Detchprohm, M. Zhu, Y. Xia, Y. Li, W. Zhao, J. Senawiratne, C. Wetzel, Physica Status Solidi (c) 5, 2207 (2008).

H. Sato, R. B. Chugn, H. Hirasawa, N. Fellows, H. Masui, F. Wu, M. Saito, K. Fujito, J. S. Speck, S. P. DenBaars, and S. Nakamura, Appl. Phys. Lett. 92, 221110 (2008).

A. Dadgar, C. Hums, A. Diez, J. Biasing, and A. Krost, J. Cryst. Growth 297, 279-282 (2006).

F. Schulze, A. Dadgar, J. Biasing, A. Diez, and A. Krost, Appl. Phys. Lett 88, 121114 (2006).

T. Egawa, B. Zhang, and H. Ishikawa, IEEE Electron. Device Lett. 26, 169 (2005).

C. Y. Chang, B. S. Kang, H. T. Wang, F. Ren, Y. L. Wang, S. J. Pearton, D. M. Dennis, J. W. Johnson, P. Rajagopal, J. C. Roberts, E. L Piner, and K. J. Linthicum, Appl. Phys. Lett. 92, 232102 (2008).

Kim et al. Nanotechnology 18, 055306, (2007). Kim et al. Appl. Phys. Lett. 91, 181109 (2007).

LumiLEDs: Status and Future of High-Power Light-Emitting Diodes for Solid-State Lighting, Michael R. Krames, Oleg B. Shcekin, Regina Mueller-Mach, Gerd O. Mueller, Ling Zhou, Gerard Harbers, and M. Geroge Craford, Journal of Display Technology, vol. 3, Issue 2, pp. 160-175 (2007).

Osram: Green ThinGaN power-LED demonstrates 100 Im, M. Peter, A. Laubsch, P. Stauss, A. Walter, J. Baur, B. Hahn, Phys. Status. Solidi. vol. 5 Issue 6, pp. 2050-2052 (2008).

Chen-Fu Chu, Fang-I Lai, Jung-Tang Chu, Chang-Chin Yu, Chia-Feng Lin, Hao-Chung Kuo, and S. C. Wanga, J. Appl. Phys. 95, 3916 (2004).

M. S. Liu, L.A. Bursill, S. Prawer, K.W Nugent, Y.Z. Tong, G. Y. Zhang, Appl. Phys. Lett. 74, 3125(1999).

Kuball et al. Appl. Phys. Lett 82, 124 (2003).

S. Zamir, B. Meyler, J. Salzman, J. Cryst. Growth, 230, 341 (2001).

Materials Letters, vol. 61, Issue 22, Sep. 2007, pp. 4416-4419.

Applied Physics A: Materials Science and Processing, vol. 89, No. 1 (2007).

Appl. Phys. Lett. 86, 081912 (2005).

* cited by examiner (a)

(b)

(a)

(b)

(d)

(e)

(a)

(b)

(c)

(a)

(b)

METHOD OF FORMING A LIGHT EMITTING DIODE STRUCTURE AND A LIGHT DIODE STRUCTURE

FIELD OF INVENTION

The present invention relates broadly to a vertical light emitting diode structure and a method for forming a vertical light emitting diode structure.

BACKGROUND

GaN-based light-emitting diode (LED) structures used in the production of high brightness light emitting diodes (LEDs) typically require removal of a sapphire or SiC substrate through laser lift-off (LLO) for transfer to conducting substrates. Such laser lift-off techniques are discussed in, for example, U.S. Pat. No. 6,071,795 and U.S. Pat. No. 6,420,242. This lift-off method is typically costly as high power lasers are used and large area sapphire/SiC substrates which are expensive are required. Also, a typical sapphire/SiC substrate is limited to a 6 inch wafer size and hence, growth potential to larger substrate sizes is limited. Also, use and maintenance of high power lasers is typically complicated and the lasers are difficult to control resulting in non-uniform yield from wafer to wafer during laser lift off of large diameter wafers. Furthermore, since sapphire substrates are insulators, for flip-chip LEDs, heat dissipation is a significant concern.

Growth of GaN on bulk Si or large area Si-based substrates is more cost effective and may lead to higher manufacturing yield. On the other hand, a significant concern for LEDs formed on Si substrates is the typical absorption of blue-green light emitted from the active layers of InGaN/GaN multi-quantum wells of the LEDs. Therefore, to obtain high brightness LEDs, removal of the Si substrates is typically necessary. In this regard, high brightness LEDs can be achieved by transferring LED structures grown on bulk silicon substrates to conducting substrates by wafer bonding or chemical lift-off processes. However, the internal quantum efficiency of LED material on bulk Si is typically lower due to a higher defect density. The defect density typically arise from a high lattice and thermal mismatch between silicon and GaN, leading to tensile stress, cracking and lowering of light emitting efficiency. Therefore, it is typically necessary to achieve high quality epitaxial LED structures on large area silicon platforms prior to fabrication of such high brightness LEDs.

Hence, in view of the above, there exists a need for a method for forming a light emitting diode structure and to a light emitting diode structure that seek to address at least one of the above problems.

SUMMARY

In accordance with a first aspect of the present invention, there is provided a method of forming a vertical III-nitride based light emitting diode structure, the method comprising forming a III-nitride based light emitting structure on a silicon-on-insulator (SOI) substrate; forming a metal-based electrode structure on the III-nitride based light emitting structure; and removing the SOI substrate by a layer transfer process such that the metal-based electrode structure functions as a metal-based substrate of the light emitting structure.

The step of removing the SOI substrate may comprise mechanically removing substrate material, etching substrate material or both.

The step of forming the III-nitride based light emitting structure may comprise growing nitride epilayers on the SOI substrate using metal organic chemical vapor deposition (MOCVD).

The mechanically removing substrate material step may comprise one or more of a group consisting of lapping, grinding and etching, wherein the mechanically removing substrate material removes SOI and Si handle material.

The etching substrate material step may comprise dry or wet etching.

The method may further comprise forming a seed layer on the III-nitride based light emitting structure for facilitating the layer transfer process.

The seed layer may comprise nickel.

The method may further comprise bonding the seed layer to the metal-based substrate using electroplating, electroless deposition or both.

The method may further comprise patterning a buried oxide layer of the SOI substrate whereby a Group III metal content in the III-nitride based light emitting structure is inhomogeneous for modulating emission of the light emitting diode structure.

The patterning step may comprise using a $SiO_2$ mask to form the patterns on (111)-oriented silicon.

The step of forming the III-nitride based light emitting structure may further comprise forming a nitride-based buffer layer directly on the SOI substrate.

The method may further comprise forming a reflective mirror layer on top of the III-nitride based light emitting structure, the mirror layer being capable of functioning as a p-type contact electrode, prior to the layer transfer process.

The reflective mirror layer may comprise a plurality of layers selected from a group of material consisting of nickel, gold, platinum, silver, palladium and ruthenium and the method may further comprise subjecting the reflective mirror layer to thermal annealing in which the temperature ranges from about 400° C. to about 700° C.

The method may further comprise selectively forming photonic crystal (PhC) structures on the III-nitride based light emitting structure after the step of removing the SOI substrate.

The method may further comprise forming an n-type contact electrode structure on an n-doped III-nitride layer of the III-nitride based light emitting diode structure after the step of selectively forming photonic crystal (PhC) structures.

The n-type contact electrode structure may comprise a plurality of layers selected from a group of material consisting of titanium, aluminium, gold, chromium and nickel.

The SOI substrate may be prepared using a separation by implantation of oxygen (SIMOX) process to create Si overlayers which vary from about 10 nm to about 300 nm thick with a buried oxide or silicon dioxide thickness ranging from about 60 to about 400 nm.

The SOI substrate may comprise a (111)-oriented Si overlayer and a (111)-oriented Si handle.

In accordance with a second aspect of the present invention, there is provided a method of forming a vertical III-nitride based light emitting diode structure, the method comprising patterning a buried oxide layer of a silicon-on-insulator (SOI) substrate; forming a III-nitride based light emitting structure on the patterned SOI substrate; removing the patterned SOI substrate, whereby a Group III metal content in the III-nitride based light emitting structure is inhomogeneous for modulating the emission from the light emitting diode structure.

The patterning step may comprise using a SiO$_2$ mask to form the patterns during a separation by implantation of oxygen (SIMOX) process.

The step of forming the III-nitride based light emitting structure may further comprise forming a buffer layer directly on the patterned SOI substrate.

The patterned SOI substrate may comprise a (111)-oriented Si overlayer and a (111)-oriented Si handle.

The SOI substrate may be patterned with micron scale circular or hexagonal concentric type shapes to induce modulated emission from the vertical III-nitride based light emitting diode structure.

The SOI substrate may be patterned using a separation by implantation of oxygen (SIMOX) process to create periodic Si overlayers which vary from about 10 nm to about 300 nm thick with a patterned buried oxide or silicon dioxide thickness ranging from about 60 to about 400 nm.

In accordance with a third aspect of the present invention, there is provided a vertical III-nitride based light emitting diode structure, the structure comprising a III-nitride based light emitting structure for light emission formed on a metal-based substrate; wherein the III-nitride based light emitting diode structure is formed by layer transfer from a silicon-on-insulator (SOI) substrate.

The structure may further comprise a metal seed layer formed between the III-nitride based light emitting structure and the metal-based substrate for facilitating the layer transfer.

The seed layer may comprise nickel having a thickness ranging from about 100 nm to about 1000 nm.

The seed layer may be bonded to the metal-based substrate using electroplating, electroless deposition or both.

A Group III metal content in the vertical III-nitride based light emitting diode structure may be inhomogeneous for modulating light emission of the light emitting diode structure.

The structure may further comprise a reflective mirror layer capable of functioning as a p-type contact electrode, the mirror layer being formed between the metal-based substrate and the III-nitride based light emitting structure.

The reflective mirror layer may comprise a plurality of layers selected from a group of material consisting of nickel, gold, platinum, silver, palladium and ruthenium.

The structure may further comprise photonic crystal (PhC) structures formed on an n-doped III-nitride layer of the III-nitride based light emitting diode structure, the PhC structures having lateral and vertical dimensions of less than about 400 nm.

The structure may further comprise photonic crystal (PhC) structures formed on an n-doped III-nitride layer of the III-nitride based light emitting diode structure by nanoscale surface patterning to create periodic patterns selected from a group consisting of nanopillars, nanoholes and nanopyramid structures.

The structure may further comprise an n-type contact electrode structure formed on the III-nitride based light emitting structure.

The n-type contact electrode structure may comprise a plurality of layers selected from a group of material consisting of titanium, aluminium, gold, chromium and nickel.

In accordance with a fourth aspect of the present invention, there is provided an III-nitride based light emitting diode structure, the structure comprising a patterned buried oxide layer of a silicon-on-insulator (SOI) substrate; a III-nitride based light emitting structure for light emission formed on the patterned SOI substrate; and wherein a Group III metal content in the active layers of the III-nitride based light emitting structure is inhomogeneous for modulating an emission of the light emitting diode structure.

The III-nitride based light emitting structure may comprise one or more nitride-based buffer layers formed directly on the patterned SOI substrate.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

In the example embodiments described below, in order to demonstrate high output power LEDs, a layer transfer process of III-nitride materials from a SOI substrate to a metal substrate is discussed. With this approach, expensive layer transfer processes (such as laser-lift-off techniques of LEDs for transfer from sapphire substrates) can be bypassed. Furthermore, using standard Si process conditions, vertical light emitting diodes on metal substrates such as copper can be achieved.

In addition, using standard Si processes, high quality buried oxide (BOX)-patterned separation by implantation of oxygen (SIMOX) Si-on-insulator (SOI) substrates can be prepared where thicknesses of Si overlayers and the underlying BOX of the SOI substrates can be controlled by varying oxygen implantation conditions. Thin and large area patterned SIMOX wafers (or substrates of more than about 150 mm in diameter) for InGaN/GaN MOCVD growth can be used. Using tunable lateral and vertical patterns within such patterned interference substrates, blue, green or dichromatic light emitting diodes can be achieved using InGaN/GaN active layers with varying In content in the quantum well layers.

Figure 1:
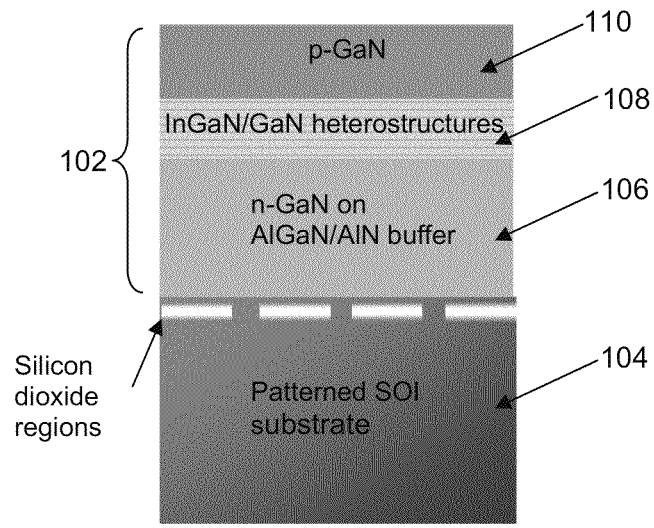
FIG. 1 is a schematic diagram illustrating a multistack layer formation in one example embodiment.

FIG. 1 is a schematic diagram illustrating a multistack layer formation in one example embodiment. A III-nitride structure for light emission in the form of a multistack layer 102 is formed on a BOX-patterned SOI substrate 104. The SOI substrate can be prepared by the SIMOX process. The multistack layer 102 comprises a silicon doped n-type GaN layer 106 formed on a nitride-based buffer layer such as an aluminum gallium nitride (AlGaN) and aluminium nitride (AlN) buffer layer initially formed on the substrate 104. For illustration purposes, the AlGaN/AlN buffer layer is not shown as a separate layer in FIG. 1. The multistack layer 102 further comprises indium gallium nitride/gallium nitride (InGaN/GaN) heterostructures 108 formed on the n-type GaN layer 106 and a magnesium doped p-type GaN layer 110 formed on the InGaN/GaN heterostructures 108. Alternatively, the layer 110 can be formed as an AlGaN layer. As yet another alternative, the p-type GaN layer 110 can comprise a combination of AlGaN/GaN layers.

Figure 2:
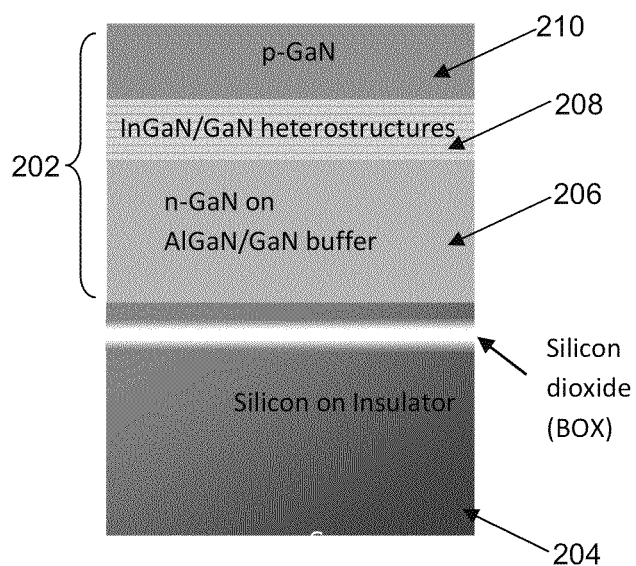
FIG. 2 is a schematic diagram illustrating a multistack layer formation in another example embodiment.

FIG. 2 is a schematic diagram illustrating a multistack layer formation in another example embodiment. A III-nitride structure for light emission in the form of a multistack layer 202 is formed on a SOI substrate 204. The BOX layer is not patterned in this example embodiment. The SOI substrate can be prepared by the SIMOX process. The multistack layer 202 comprises a silicon doped n-type GaN layer 206 formed on a nitride-based buffer layer such as an aluminum gallium nitride (AlGaN)/aluminium nitride (AlN) buffer layer initially formed on the substrate 204. For illustration purposes, the AlGaN/AlN buffer layer is not shown as a separate layer in FIG. 2. The multistack layer 202 further comprises indium gallium nitride/gallium nitride (InGaN/GaN) heterostructures 208 formed on the n-type GaN layer 206 and a magnesium doped p-type GaN layer 210 formed on the InGaN/GaN heterostructures 208. Alternatively, the layer 210 can be formed as an AlGaN layer. As yet another alternative, the p-type GaN layer 210 can comprise a combination of AlGaN/GaN layers.

In FIGS. 1 and 2, the substrates 104, 204 can be interchangeable with a SOI substrate, a patterned SOI substrate or a strain-released GaN on a patterned SOI substrate. In the example embodiments, the GaN structures are preferably grown on a buffer layer to reduce GaN epilayer cracking. The multistack layers 102, 202 are also known as nitride epilayers.

Figure 3:
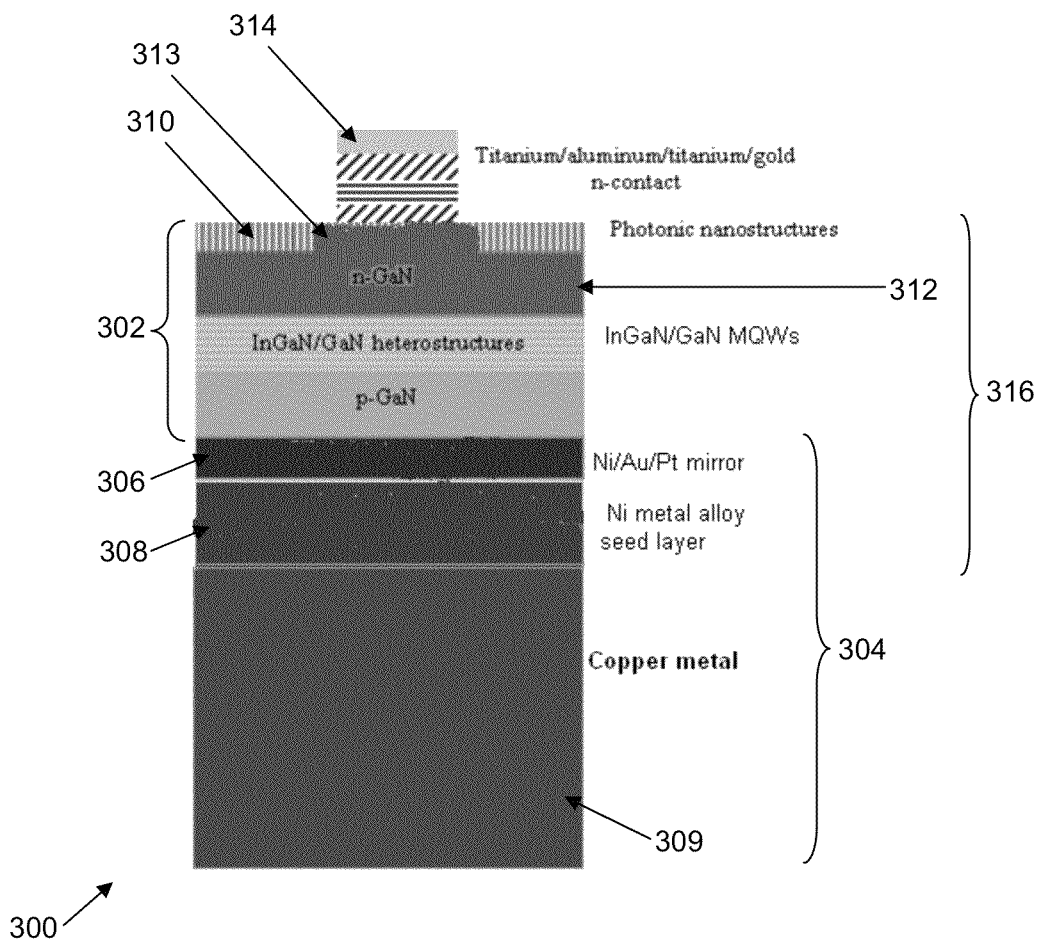
FIG. 3 is a schematic diagram illustrating a light emitting diode (LED) structure produced by a layer transfer process in an example embodiment.

FIG. 3 is a schematic diagram illustrating a LED structure 300 produced by a layer transfer process in an example embodiment. In the example embodiment, a SOI substrate with a LED structure formed thereon, for example as shown in FIGS. 1 and 2, is used. Prior to the layer transfer process, a nickel/gold/platinum (Ni/Au/Pt) mirror layer 306 is formed on a p-GaN layer of the LED structure such as p-GaN layer 110 (FIG. 1) or p-GaN layer 210 (FIG. 2). A Ni metal alloy seed layer 308 is formed on the Ni/Au/Pt mirror layer. Conductive copper metal 309 is electrodeposited on the Ni metal alloy seed layer 308. The combination of nickel, gold, platinum and copper make up a metal stack substrate 304. The SOI or patterned SOI substrate e.g. 104 (FIG. 1) or 204 (FIG. 2) is then removed for the layer transfer process. The substrate is removed by a mechanical process such as lapping and a dry etching process using fluorine chemistry such as $XeF_2$. For example, substrate 104 (FIG. 1) or substrate 204 (FIG. 2) is removed such that e.g. multistack layer 102 (FIG. 1) or multistack layer 202 (FIG. 2) on the metal stack substrate 304 is formed as a result of the layer transfer process. The multistack layer 102 (FIG. 1) or 202 (FIG. 2) on the metal stack substrate 304 is then inverted such that the n-GaN layer is on the top-side. In the example embodiment, the metal stack substrate 304 comprises a combination of nickel, gold, platinum and copper and can act as a p-type electrode.

In the example embodiment, photonic nanostructures e.g. 310 are selectively formed on the n-GaN layer 312. The formation is via, for example, nanolithography techniques. The n-GaN layer 312 is also patterned for forming contacts, e.g. region 313. An n-type contact electrode 314 comprising a titanium/aluminum/titanium/gold metal stack is then formed on the patterned n-GaN layer 312 surface i.e. an n-doped III-nitride layer. As one alternative, the electrode 314 can comprise a titanium/aluminum/chromium/gold metal stack. The p-type contact e.g. substrate 304 and n-type GaN layer 312 are used for electrical connection to drive the LED chip at different injection currents.

In the example embodiment, a thin film vertical light emitting diode (VLED) structure 316 is formed on the copper-based metal substrate 304.

Using the example embodiment, a sample vertical LED chip can be formed. As will be described in more detail below, the sample vertical LED chip transferred from a SOI substrate to a copper substrate can be driven at an injection current higher than about 1 Amp for a LED chip size of about 1 mm×1 mm. No electro-luminescence (EL) degradation was advantageously observed from a sample vertical LED chip even when the sample vertical LED chip is driven at about 800 mA forward current. The junction temperature measured directly on the sample LED chip during high current operation (up to about 1 Amp) was advantageously lower than 125° C. due to the presence of the high thermal conductive copper metal substrate. This enables high power operation of the sample LED chip. It is noted that with packaging, the light output power of the photonic crystal sample vertical LED chip can deliver high luminance efficacy.

In an example embodiment, a vertical LED chip can be fabricated using multi-color InGaN/GaN LED structures grown by metal organic chemical vapor deposition (MOCVD) on a patterned SIMOX SOI substrate.

In example embodiments, different SOI substrates may be prepared for use. The thickness of inherent Si overlayers of the substrates can vary from, but is not limited to, about 10 nm to about 300 nm with a patterned buried oxide or silicon dioxide thickness ranging from, but not limited to, about 60 to about 400 nm. A patterned SIMOX SOI substrate can be created by using a micro- or nano-patterned $SiO_2$ mask during the SIMOX process. After thermal annealing and removal of top oxide layers of the SOI substrate, a buried oxide (BOX)-patterned (111)-oriented SIMOX SOI substrate can be obtained.

Figure 4:
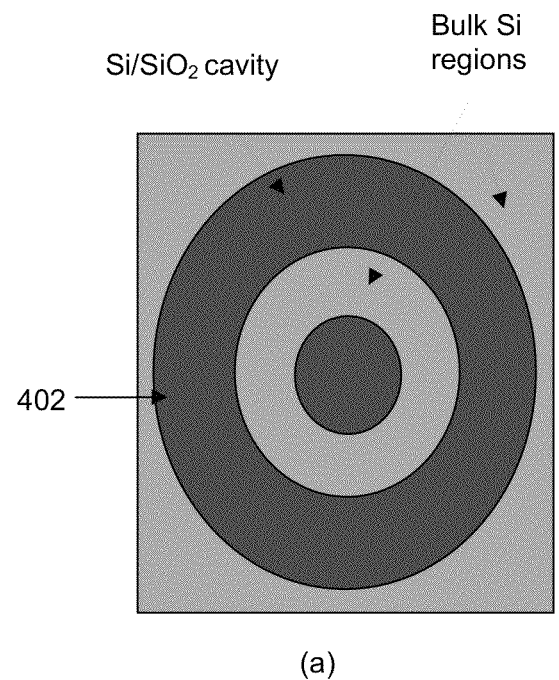
FIGS. 4(a) and (b) illustrate examples of different mask patterns for creating a buried-oxide (BOX) Separation by Implantation of Oxygen (SIMOX) substrate in an example embodiment.
Figure 4:
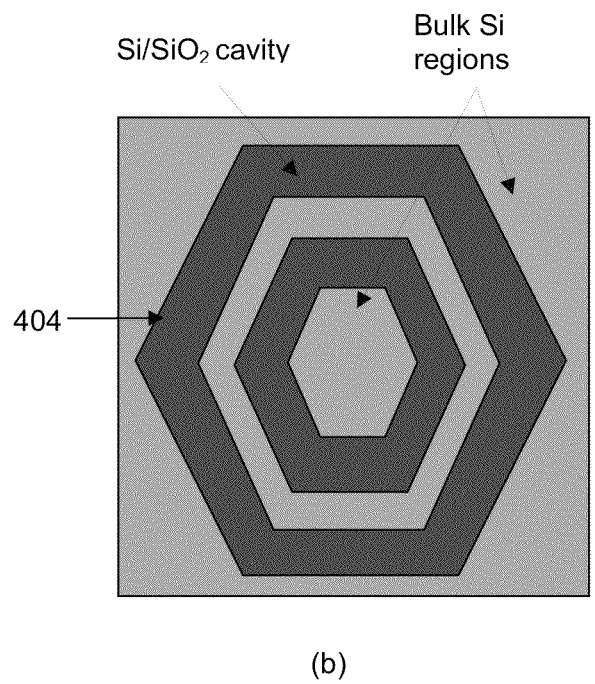

FIGS. 4(a) and (b) illustrate examples of different mask patterns for creating a BOX SIMOX substrate in an example embodiment. FIG. 4(a) shows a micron scale circular concentric pattern with the buried oxide shown at numeral 402. FIG. 4(b) shows a micron scale hexagonal concentric pattern with the buried oxide shown at e.g. numeral 404. The patterns can be provided across e.g. a 6-inch wafer. The patterns are chosen for desired dimensions of LED chips. The thickness of the inherent Si overlayer and lateral dimensions of the patterned BOX can advantageously be chosen to modulate emission spectra of the subsequently formed LEDs at desired application-specific wavelengths. The epitaxial process of depositing nitrides can start with a high temperature growth of an AlN buffer layer at a temperature higher than about 1050° C. It will be appreciated that 8 inch Si <111> wafers are available commercially for creation of BOX SIMOX substrates and 12 inch Si <111> wafers can also be obtained from substrate vendors. The above patterning processes can be carried out on such larger wafers.

The lateral dimensions of the patterned BOX can be chosen to create indium content modulation-induced emission in multiple quantum wells across a same LED chip. Creation of the patterned BOX can modulate the indium content laterally, i.e. creating an inhomogeneous metal content in the heterostructures (compare 108 in FIG. 1) across a patterned SIMOX SOI wafer and produce an interference substrate at longer wavelengths by the patterned SIMOX SOI substrate. A BOX-patterned SOI (111) substrate can be created to enhance interference and color tuning. The above selection process allows a higher indium content incorporation during MOCVD epitaxy due to a change in surface temperature and thus, can result in InGaN/GaN multiple quantum wells with high indium content. In an example embodiment, the patterned buried oxide layer causes differences in surface temperature that can vary indium content subsequently to cause modulation-induced emission. The resulting enhancement characteristics are maintained even after removal of the patterned SOI substrate as a result of layer transfer. Thus, the varying In content can achieve modulated emission spectra.

In the example embodiment, a SOI substrate is prepared using a separation by implantation of oxygen (SIMOX) process to create Si overlayers with a thickness which can vary from, but is not limited to, about 10 nm to about 300 nm with a buried oxide or silicon dioxide thickness ranging from, but not limited to, about 60 nm to about 400 nm. In one example, a SOI substrate can be prepared to comprise a (111)-oriented Si overlayer and a (111)-oriented Si handle.

The inventors recognise that growth of GaN on patterned SOI substrates or strain-released GaN on BOX-patterned SIMOX SOI substrates can result in internal quantum efficiency values of multiple quantum well material that is comparable to values obtained from devices fabricated using sapphire or SiC substrates.

It will be appreciated that LED structures formed on such SOI patterns can comprise a plurality of layers of, example, n-type Si-doped AlGaN/GaN interlayers, InGaN/GaN multi-quantum wells (MQWs), and Mg-doped p-type AlGaN/GaN layers. For illustration purposes, many of such layers are not shown in the drawings for describing the example embodiments.

FIGS. 5(a), (b) and (c) are schematic diagrams for illustrating a layer transfer process in an example embodiment. A SIMOX SOI patterned substrate 502 is provided. A LED chip size can be chosen based on predesigned SIMOX SOI patterns provided on the substrate 502 so that light emission can be efficient. The SOI patterns/layers are shown schematically as region 504. The substrate body below the region 504 is referred to as the Si handle.

A LED structure is formed as follows in one example embodiment. An AlN buffer layer 506 is formed on the substrate 502 by MOCVD growth after initial cleaning of the patterned SOI substrate 502 (or SOI substrate in other embodiments). The MOCVD process is carried out at a temperature above about 1000° C. and in hydrogen ambient. The growth temperature of this buffer layer 506 can vary from about 900 to about 1150° C. depending on the SOI and buried oxide layer thickness. The trimethylaluminum flow rate and time can be varied to obtain an optimized AlN buffer thickness in the 20-300 nm range. The buffer layer 506 can alternatively comprise AlGaN material. Alternatively, the buffer layer 506 can additionally comprise AlGaN material to function as an AlGaN/AlN interlayer where the thickness of the AlGaN layer varies from about 50 to about 100 nm. A n-type GaN layer 508 is formed on the buffer layer 506 with the growth temperatures in a range between 950 to about 1050° C. Multiple quantum wells or indium gallium nitride/gallium nitride (InGaN/GaN) heterostructures 510 are formed on the n-type GaN layer 508. A p-type GaN layer 512 is then formed on the multiple quantum wells.

The number of periods in the $In_x Ga_{1-x} N/GaN$ multiquantum wells can vary based on design of blue or green emitting layers. Preferably, a period between 1 to 20 can offer high power emission. In the example embodiment, for the multiple quantum wells, the thickness of the $In_x Ga_{1-x} N$ quantum well layer is in the range of about 2 to about 20 nm. The thickness of the GaN barrier layer can be in the range of about 3 to about 40 nm. The $In_x Ga_{1-x} N$ quantum well layer has a larger composition on SOI. That is, on top of SOI or patterned SOI, the In content in active layers is higher as compared to on top of bulk silicon or on top of bulk Si of patterned SOI. The growth temperature for growing the multiple quantum wells is varied between about 700° C. to about 850° C. to tune the In content on the patterned SOI substrate 502 (or SOI substrate in other embodiments).

After the growth of the LED structure 514 on the SIMOX SOI substrate 502, a p-type metal contact layer structure 516 (also referred to as a metal stack substrate 516) is deposited on the LED structure 514 surface by electron-beam evaporation. For example, a Ni layer 518 of about 5 nm thick is deposited on the LED structure 514. This is followed by an Au layer 520 of about 5 nm thick deposited on the Ni layer 518. Alternatively, layer 520 can comprise Ag. A Pt layer 522 of about 100 to 200 nm thick is deposited on the Au layer 520. As an alternative, the layers 518, 520, 522 can be a combination of Ni/Ag/Pt layers. Other metals such as palladium or ruthenium can also be used. The layers 518, 520, 522 form a reflecting mirror and the mirror is capable of functioning as a p-type contact electrode. A thin Ni layer 524 of about 100 to about 1000 nm thick is then electroplated on top of the reflecting mirror. The Ni layer 524 functions as a conductive seed layer. The p-type metal contact layer structure 516 is then subjected to thermal annealing in the temperature range of about 400° C. to 700° C.

The conductive seed layer, i.e. Ni layer 524, allows thick copper electroplating or electroless deposition to form a copper layer 528. The thickness of the electroless-deposition or electroplated copper layer 528 can be higher than or equal to about 150 micrometer. The thickness is chosen such that the LED structure does not suffer from significant bowing or cracking during substrate removal for the layer transfer process. It will be appreciated that the Ni and copper layers 524, 528 can also be formed by a combination of both electroplating and electroless deposition methods.

After formation of the metal stack substrate 516, removal of the SOI substrate 502 is performed. The substrate removal step comprises grinding, lapping, and dry etching of the Si handle and SOI layers (or buried silicon dioxide layers and silicon overlayer) at region 504. For example, lapping, grinding and polishing processes can be performed on the SOI substrate 502 to reduce the substrate 502 to a certain thickness, followed by an isotropic dry or wet etching of the remaining substrate material. The etching processes can be potassium hydroxide wet etching or dry etching using fluorine (e.g. SF6 or XeF$_2$) chemistry. The etching processes are terminated at the AlN buffer layer 506.

Figure 5:
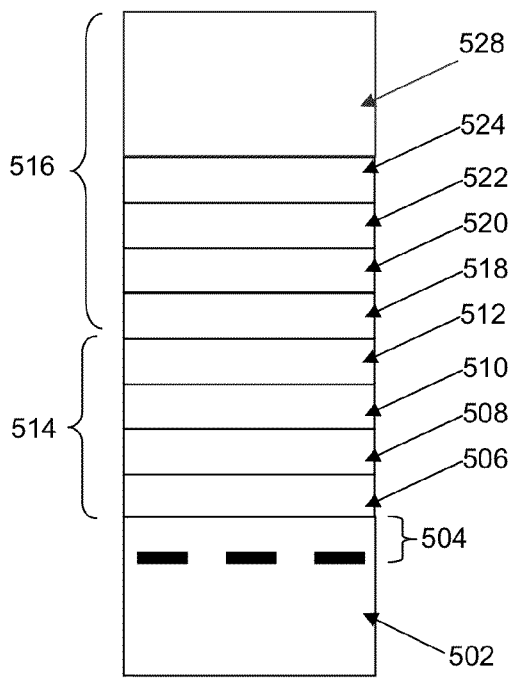
FIGS. 5(a), (b) and (c) are schematic diagrams for illustrating a layer transfer process in an example embodiment.
FIGS. 5(d) and 5(e) are schematic diagrams for illustrating generation of photonic crystal patterns/structures on a vertical LED structure in the example embodiment.
FIG. 5(f) is a schematic diagram illustrating deposition of an n-electrode on a vertical LED structure in the example embodiment.
Figure 5:
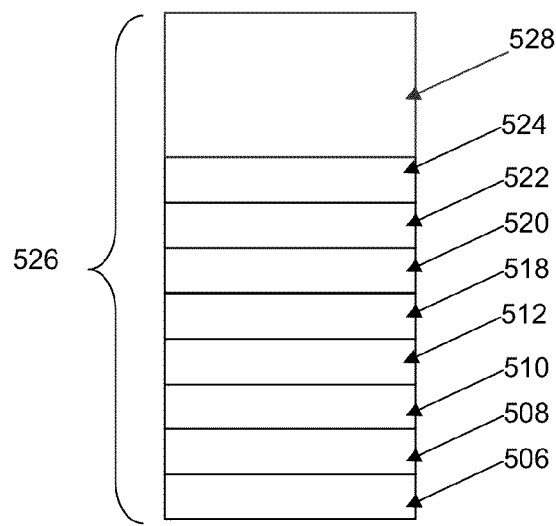
Figure 5:
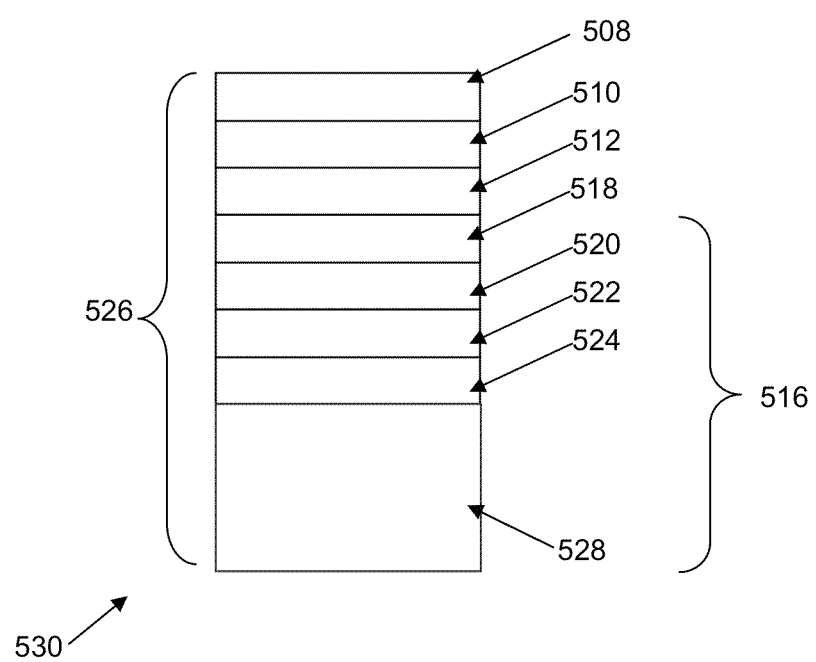
Figure 5:
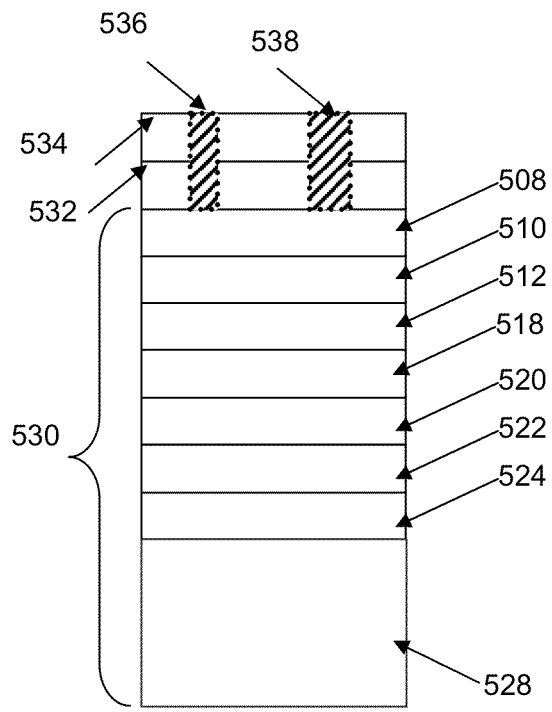
Figure 5:
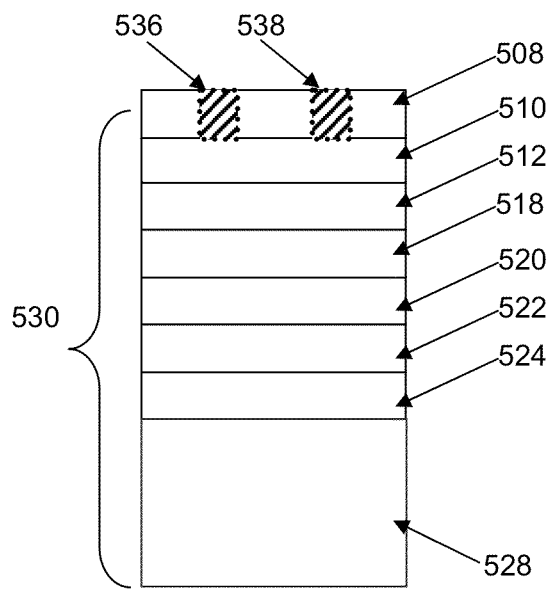
Figure 5F:
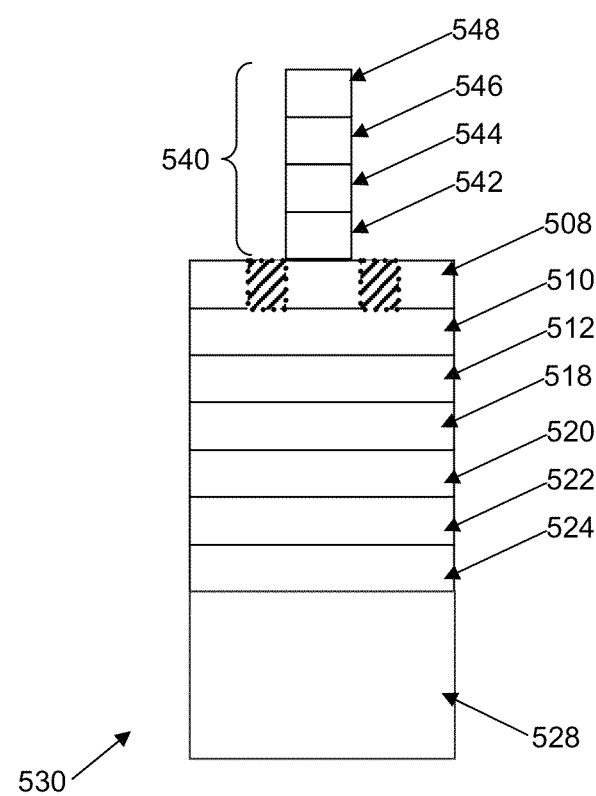

FIG. 5(*b*) shows the resultant structure 526 with the substrate 502 removed. The AlN buffer layer 506 is thus exposed upon substrate removal. The exposed n-type AlN/AlGaN/GaN layers or interlayers, e.g. layers 506, 508 are then subjected to an inductively coupled plasma etching (ICP) process using with BCl$_3$/Cl$_2$ chemistry. Through the ICP process, the structure 526 is now thinned down to a thickness of less than about 1 micrometer. The buffer layer 506 is removed in the process to expose the silicon-doped n-type GaN layer 508. For example, the thickness of such a thin film vertical device may be about 600 to about 800 nm, depending on the desired emission in the blue-green spectral regions. Also, for example, the thickness of the silicon-doped n-type GaN layer 508 is chosen to maximise light extraction from the multiple quantum wells or heterostructures 510. This is to confirm the cavity thickness as the total vertical nitride structure thickness is within the Fabry-Perot cavity: e.g. GaN/Air and bottom metal mirrors would modulate the emission to show long wavelength fringes when In content is tuned in the LED chips. This is a basis to chose an appropriate cavity design with photonic structures on top.

After the ICP process, the structure 526 is inverted such that the n-type GaN layer 508 is on the up-side and the metal stack substrate 516 prepared by electroplating or electroless deposition acts as a bottom electrode. FIG. 5(*c*) shows the structure 526 having the metal substrate 516. Thus, the structure 526 is provided on the metal substrate 516 via a layer transfer process. The resultant vertical LED structure is referenced as numeral 530.

After the layer transfer process, photonic crystal patterns/structures is generated on the up side n-type GaN layer 508 surface.

FIGS. 5(*d*) and 5(*e*) are schematic diagrams for illustrating generation of photonic crystal patterns/structures on the vertical LED structure 530 in the example embodiment.

In the example embodiment, fabrication of two-dimensional (2D) photonic crystal structures (PhC) structures on the vertical LED structure 530 surface is carried out by electron beam lithography (EBL) using a 2D SiO$_2$ nanomask. Alternatively, other nanolithography processes such as nanoimprinting, nanosphere, or anodic aluminum masking can be used to create dry-etched n-GaN photonic nanostructures.

In the example embodiment, a thin SiO$_2$ layer 532 is deposited using plasma enhanced chemical vapor deposition on the vertical LED structure 530. A ZEP520A photo resist layer 534 is coated on the SiO$_2$ layer 532 for the purpose of writing nanoholes to form, for example, a square, triangular, or rhombic lattice structure. As alternatives to nanoholes, structures such as nanopillars and nanopyramid structures can also be used. SiO$_2$ nano-patterns e.g. 536, 538 are created using a reactive ion etching (RIE) system utilising CHF$_3$/Ar chemistry. An inductively coupled plasma (ICP) etching of the n-GaN layer 506 surface is then carried out using BCl$_3$/Cl$_2$ gas chemistry. The ICP etching parameters can be varied to generate shallow or deeper etched nano-patterns e.g. 536,538 on the LED structure 530 surface. That is, the size and depth can be controlled by the ICP etching. The lateral and vertical dimensions of the nano-patterns is less than, but not limited to, about 400 nm in one example embodiment. That is, the etch depth can be within the top n-type layer 508 if the vertical LED structure total thickness is about 800 nm.

FIG. 5(*e*) shows the resultant vertical LED structure 530 with nano-patterns e.g. 536,538. By tuning the nanohole diameters on a SiO$_2$ mask, the periodicity of the PhC lattice and etching parameters, various sizes and shapes of nano-patterns can be obtained.

After the creation of photonic crystal structures on the n-type GaN layer 508 surface, a patterned n-electrode is deposited.

FIG. 5(*f*) is a schematic diagram illustrating deposition of an n-electrode on the vertical LED structure 530 in the example embodiment.

In the example embodiment, a n-type contact structure 540 is patterned and deposited on the n-type GaN layer 508. The n-type contact structure 540 formed on the vertical LED structure 530 comprises a combination of Ti/Al/Ti/Au layers (shown schematically at numerals 542,544,546,548 respectively). Alternatively, the contact structure 540 can comprise a combination of Ti/Al/Ni/Au or Cr/Ni/Au layers. The layers 542,544,546,548 are formed of different thicknesses. For example, the Ti/Al/Ti/Au n-contact metal stack thicknesses at numerals 542,544,546,548 are about 10/150/15/500 nm thick respectively. The top n-electrode layer 548 is terminated with thick Au to wire bond the LED structure 530. A thermal treatment is then employed to anneal the n-metal contact layers 542,544,546,548 for efficient current injection and to reduce the contact resistance. The metal contact layers 542, 544,546,548 can be annealed either by a short-time rapid thermal annealing step or by using a short-time high power pulsed UV laser annealing method.

The high power vertical light emitting diode structure 530 can then be mounted on a highly conducting host substrate e.g. by die bonding followed by wire bonding of the electrodes and an encapsulation process. A sample encapsulated LED device fabricated according to the described example embodiment showed electroluminescence peaks covering the spectral range of about 400 nm to about 700 nm.

Figure 6:
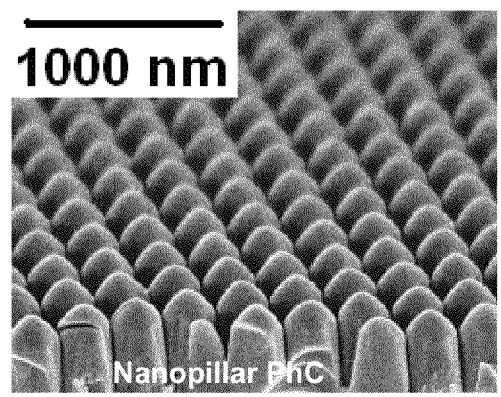
FIGS. 6(a) to (c) show example scanning electron microscope (SEM) images of photonic crystal structures in different example embodiments.
Figure 6:
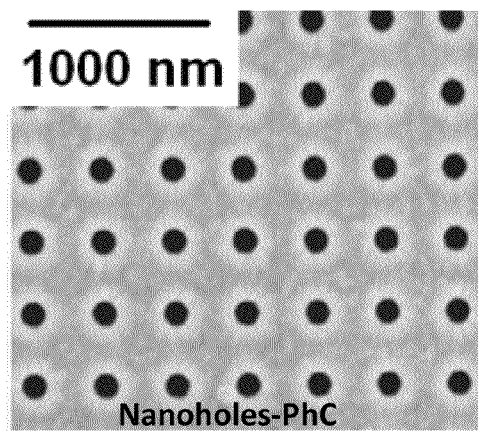
Figure 6:
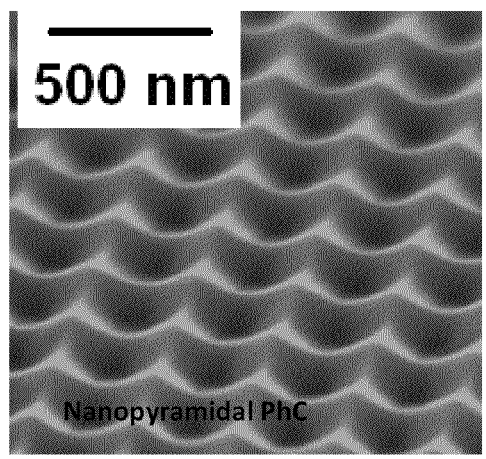

FIGS. 6(*a*) to (*c*) show examples of scanning electron microscope (SEM) images of photonic crystal structures in different example embodiments. Photonic crystal structure formation in an example embodiment has been described with reference to FIGS. 5(*d*) and (*e*). Photonic crystal structures can be created on GaN surfaces for fabrication of photonic crystal high power vertical LED structures on copper substrates. FIG. 6(*a*) shows a SEM image of nanopillar type photonic crystal structures. FIG. 6(*b*) shows a SEM image of nanohole type photonic crystal structures. FIG. 6(*c*) shows a SEM image of nanopyramidal type photonic crystal structures.

A particular pattern shape can be chosen to suit a desired thickness of a vertical LED structure and the desired emitted wavelength from the LED structure. The shape and etch depth of patterns can be chosen for efficient light extraction. Different types of shapes such as nanopyramidal facets, holes, pillars or rings can be used.

Light-extraction efficiency (LLE) is a significant factor for higher luminescence GaN LEDs. The LLE can be increased by reducing reflection of light on the LED surface. Such internally generated light extraction can enhance the lumens per watt (lm/W) values. Although the presence of PhC structures on LED top surfaces suppress the so-called Fabry-Perot cavity effect, the inventors recognise that green vertical LED structures having such PhC structures show substantial emission intensity enhancement.

As described above, in an example embodiment, a LED structure is grown on a SIMOX SOI substrate and undergoes a layer transfer process to a metal substrate to create a vertical-injection GaN-based LED structure. The LED structure can show a better current injection, more efficient thermal dissipation by the copper substrate, a true Lambertian emission profile, and enhanced reliability for long-term operation. In the vertical-injection thin GaN LED structure, a thermally conductive thick supporter Cu is used as a receptor substrate for a LED structure transferred from an initial SIMOX SOI substrate. The processing steps to create a n-side-up GaN-based photonic nanostructured LED structure can comprise the formation of metal electrodes, photolithography, dry etching and nanoscale etching of n-GaN etc.

A sample vertical LED structure was fabricated according to the above described example embodiments to study the I-V characteristics of the vertical LED structure using a current-voltage probe station.

Figure 7:
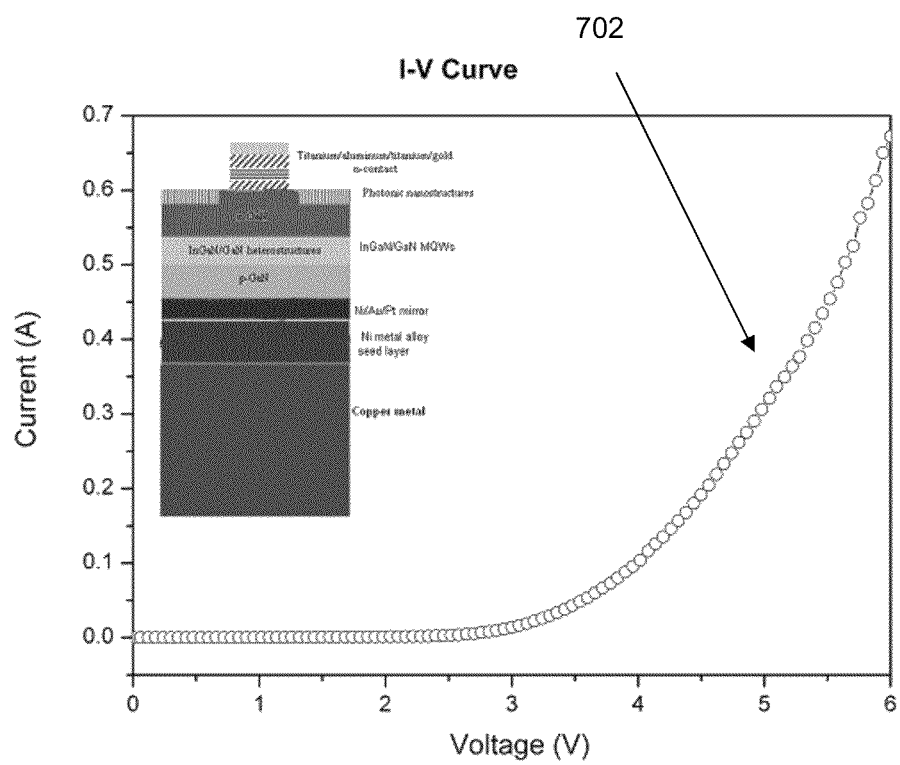
FIG. 7 is an current-voltage (I-V) graph plotted for a sample vertical LED structure having a copper substrate.

FIG. 7 is an I-V graph 702 plotted for a sample vertical LED structure having a copper substrate. The graph 702 shows the current characteristics with respect to voltage applied to the sample LED structure. The LED structure can be driven at high currents (above 0.7 A) and the turn-on voltage is lower than about 3 V.

Figure 8:
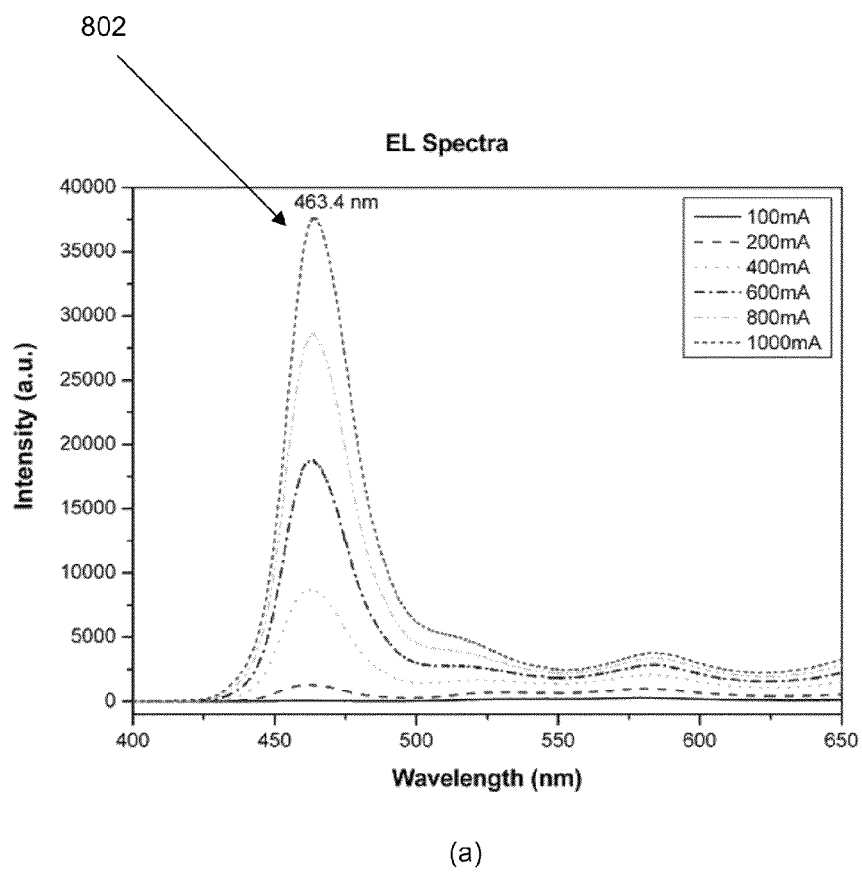
FIG. 8(a) is an electroluminescence (EL) spectra graph plotted for a sample vertical LED structure having a copper substrate and driven at different current levels.
FIG. 8(b) is an electroluminescence (EL) spectra graph showing light emission from another sample vertical LED structure with nanopyramidal photonic crystal structures etched into an n-type Si-doped GaN surface.
Figure 8:
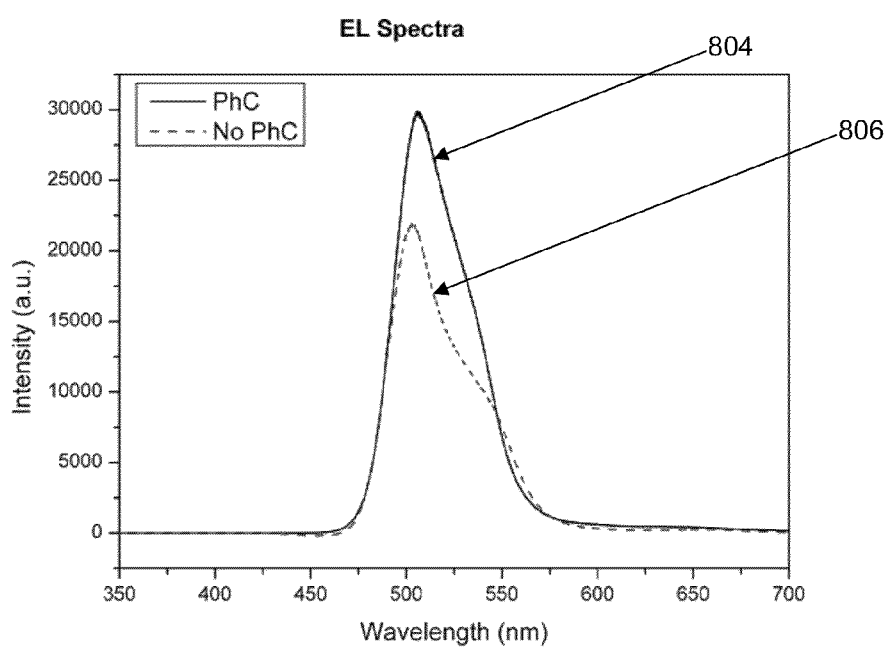

FIG. 8(a) is an electroluminescence (EL) spectra graph plotted for the sample vertical LED structure having a copper substrate and driven at different current levels. The EL spectra show a strong blue emission (having wavelength of about 463.4 nm) from the sample vertical LED structure and enhanced EL peak intensity even up to about 1 A current (i.e. very high current level), see numeral 802 for 1 A current. As can be observed, the peak EL intensity at 1 A current is between about 35000 a.u. to about 37500 a.u. The enhanced peak intensity and strong emission is believed to be due to the thick thermal conductive copper substrate.

FIG. 8(b) is an electroluminescence (EL) spectra graph showing light emission from another sample vertical LED structure with nanopyramidal photonic crystal structures etched into the n-type Si-doped GaN surface. The current injected in this case is about 20 mA for a comparison to show enhanced emission from the photonic structured vertical LED sample (compare 804) as compared to a LED without any nanopatterns (compare 806).

In the samples, the thermal dissipation from the active layers is more efficient due to close proximity of the InGaN/GaN MQWs to the copper substrate. The sample vertical LED structures are formed on a chip with dimensions of about 1 mm by 1 mm. It has been recognised by the inventors that different n-contact electrode designs can enable even better current spreading in the sample vertical LED structure and high input power leads to higher brightness. For example, the n-contact electrode can be designed with patterns having different line widths which can allow efficient current spreading and maximum light output.

Due to the Joule heating at the p-n junction of the sample LED structure, the operating temperature can be quite high at higher injection currents. Thus, the inventors sought to estimate the junction temperature in vertical LED structures transferred from Si-based substrates. Compared to thermal conductivity of sapphire (about 42 Watts/(meter-Kelvin) or W/mK) and GaN (about 177 W/mK), copper possesses significantly better thermal conductivity (about 400 W/mK) as well as better electrical conductivity.

In the sample thin film vertical LED structure, the placement of the copper host/substrate close to the p-n junction is advantageous in dissipating heat generated under high current operations. The heating of e.g. blue and green LED chips are expected to be slightly different due to the presence of a comparatively higher defect density in green emitting material. In addition, changes in the forward temperature and voltage for a high power LED chip may ask for a proper heat sink for input power that is more than about 4 W. The inventors recognise that the heating effects reduce power conversion efficiency and packaged device lifetime.

To measure the junction temperature of the sample vertical LED structure, micro-Raman spectroscopy was used. The so-called Raman method is a technique to probe optical phonon-peak shift with high spectral resolution when devices are under operation, as described for example in Chen-Fu Chu et. al. in J. Appl. Phys. 95, 3916 (2004) and M. S. Liu et. al. in Appl. Phys. Lett. 74, 3125 (1999), the contents of which are herein incorporated by cross-reference. For GaN-based devices, nonpolar $E_2$(high) mode peak energy position changes corresponding to increasing LED drive current is used for estimating junction temperature, as the Raman peak shift is proportional to the change in the junction temperature. With a high spectral resolution Raman spectrometer, junction temperature can be measured with an accuracy of about ±10° C.

Figure 9:
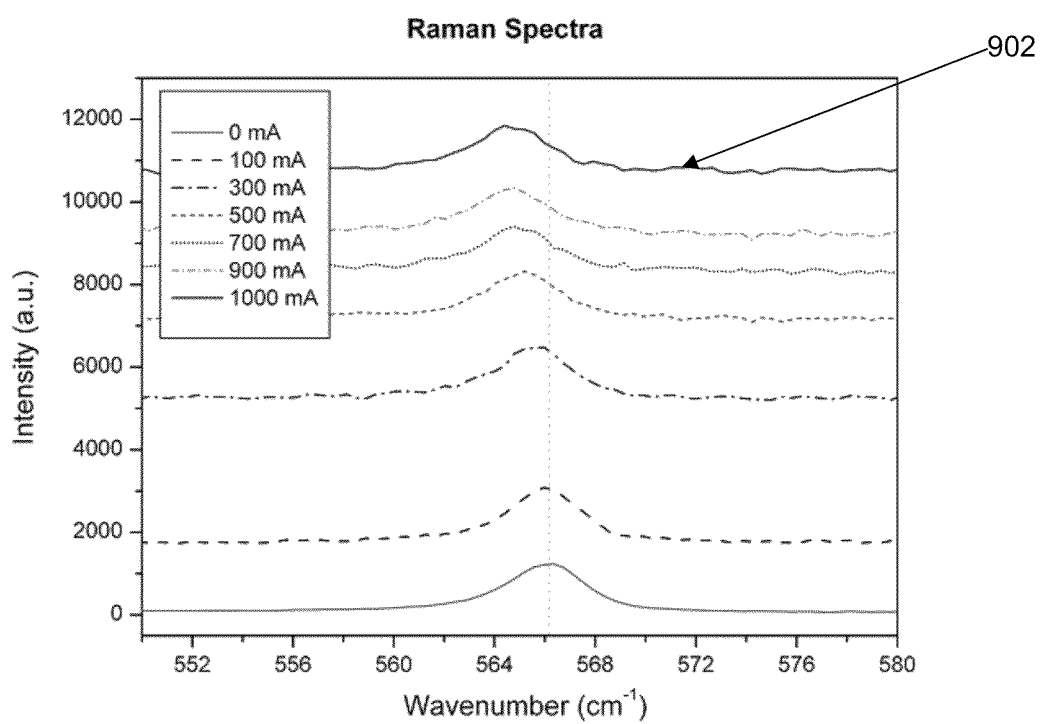
FIG. 9 is a Raman spectra graph plotted for a sample vertical LED structure having a copper substrate and driven at different current levels.

FIG. 9 is a Raman spectra graph plotted for a sample vertical LED structure having a copper substrate and driven at different current levels. In the measurement, a 488 nm line of an Ar ion laser is used to measure the Raman spectra from the sample vertical LED structure driven at higher injection currents. It is observed that the $E_2$-high phonon peak shifts within a range of 2 $cm^{-1}$ when the sample vertical blue LED chip is driven at about 1 A current (compare graph 902). With increased drive currents, the Raman peak shifts toward a lower energy side due to a change in thermal expansion. The stress state of the sample vertical LED structure is monitored using Raman spectroscopy and it is observed that there is a very small change of in-plane strain after layer transfer to a copper substrate. With a proper calibration of peak shift with temperature, it is estimated that a junction temperature of less than about 150° C. is present when the sample blue LED structure is driven at about 1 A current. The inventors recognised that with high quality epitaxial material, the junction temperature in vertical LEDs on copper substrates can be further reduced. For example, the best achieved dislocation density on a 6 inch substrate for blue LEDs is about $10^9$ $cm^{-2}$. If the defect density is lowered, junction temperature can be reduced, thus allowing higher driving currents and providing higher brightness.

Figure 10:
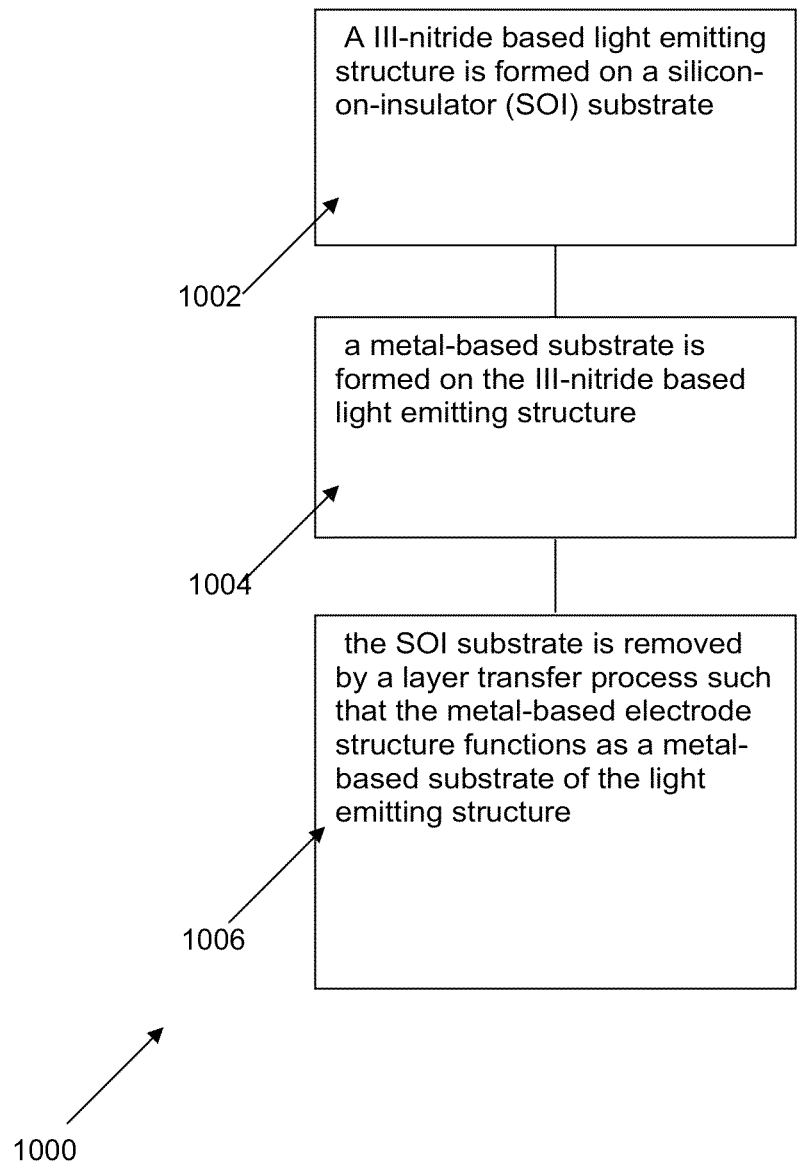
FIG. 10 is a schematic flowchart illustrating a method for forming a light emitting diode structure in an example embodiment.

FIG. 10 is a schematic flowchart 1000 illustrating a method of forming a light emitting diode structure in an example embodiment. At step 1002, a III-nitride based light emitting structure is formed on a silicon-on-insulator (SOI) substrate. At step 1004, a metal-based substrate is formed on the III-nitride based light emitting structure. At step 1006, the SOI substrate is removed by a layer transfer process such that the metal-based electrode structure functions as a metal-based substrate of the light emitting structure.

Figure 11:
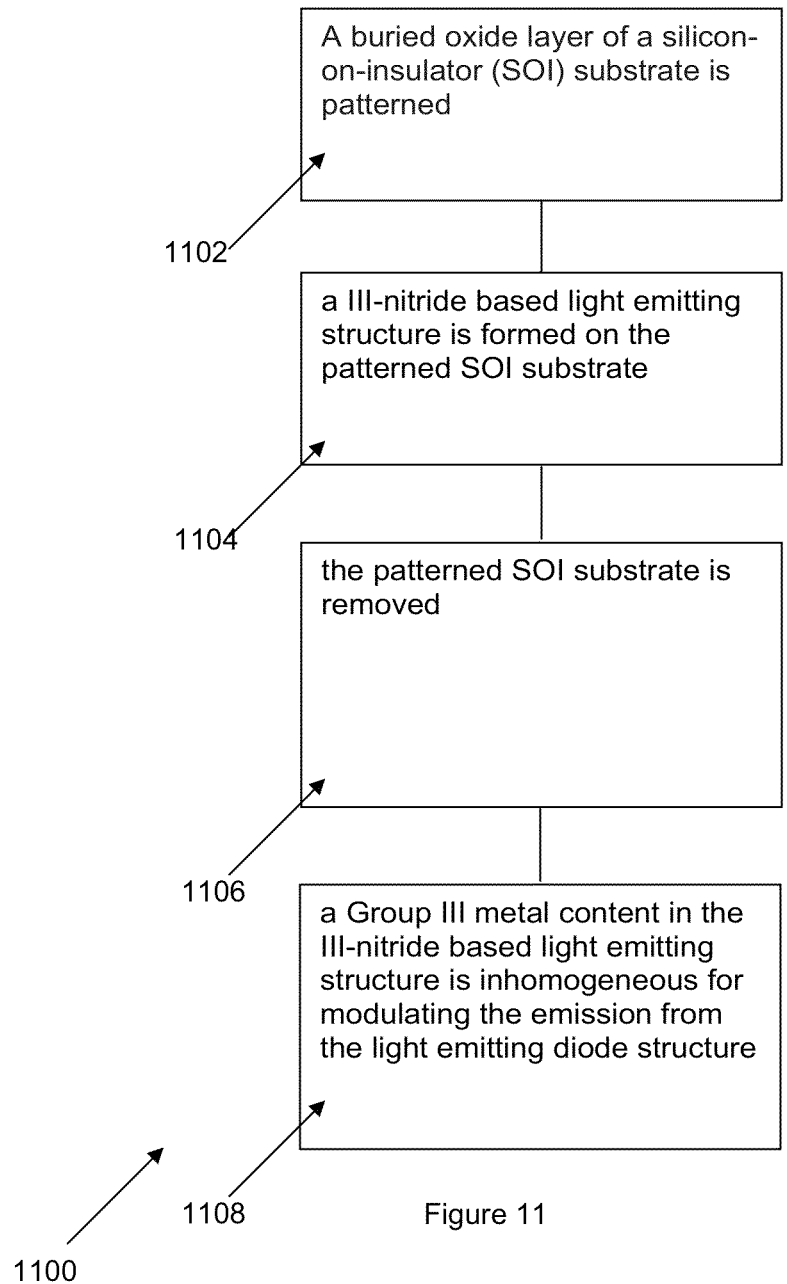
FIG. 11 is a schematic flowchart illustrating a method for forming a light emitting diode structure in an example embodiment.

FIG. 11 is a schematic flowchart 1100 illustrating a method of forming a light emitting diode structure in an example embodiment. At step 1102, a buried oxide layer of a silicon-on-insulator (SOI) substrate is patterned. At step 1104, a III-nitride based light emitting structure is formed on the patterned SOI substrate. At step 1106, the patterned SOI substrate is removed. At step 1108, a Group III metal content in the III-nitride based light emitting structure is inhomogeneous for modulating the emission from the light emitting diode structure.

Using the above described example embodiments, vertical light emitting devices with 500 um×500 um, 1 mm×1 mm and 2 mm×2 mm dimensions can be produced. The average output power of a vertical light emitting device for a 1 mm×1 mm chip size was found to be better when fabricated from a SIMOX SOI substrate than a conventional vertical light emitting device obtained from bulk silicon. With proper packaging and increased chip size to a 2 mm configuration, the output power is believed to be able to be significantly increased further. In addition, the internal quantum efficiency of the InGaN/GaN materials can be increased to progress to a desired target of about 100 lm/W for high power vertical LEDs (VLEDs). The above described example embodiments can also provide photonic structures on a VLED surface using various lithographic techniques. With the photonic structures, light extraction can be improved significantly. In addition, with a substrate removal step in conjunction with usage of a copper substrate, a VLED can be driven with high current of up to, but not limited to, about 1 A without significant junction temperature increase as shown by Raman spectra.

The above described example embodiments can offer a simple solution to fabricate photonic structured vertical light emitting diode structures by using electroluminescent InGaN/GaN LED material grown on thin and large area SOI and patterned substrates. The above described example embodiments can form vertical LED structures based on epitaxy on SIMOX SOI substrates or patterned SIMOX SOI substrates. Thus, the above described example embodiments can produce high quality GaN films which are crack free with low defect density (e.g. screw dislocation density on a 6 inch growth mode for blue LEDs that is less than about $10^9$ cm$^{-2}$) as compared to bulk silicon. The above described example embodiments can enable LED structures to be grown on a wide area SOI substrate (up to about 8 inch). The above described example embodiments can provide a processing method that is relatively compatible to silicon processing which allows it to fabricate vertical LED structures using current silicon processing tools. Hence, fabrication and production cost of GaN vertical LED structures can be minimized by realizing compatibility to silicon processing. Thus, higher throughput production of LED structures could also be realized.

Applications that can utilise the described example embodiments include low-cost solutions for street lighting and general illumination; automotive lighting; specialized light applications such as multi-color LEDs for color mixing and biomedical applications etc.

From the growth point of view, as a large area compliant SOI substrate can reduce wafer bowing during MOCVD epitaxy, it has been found possible to achieve large area layer transfer for vertical LED chips. Using the SIMOX SOI approach, the luminescence efficiency can be improved due to a microcavity effect via patterning.

In the above described example embodiments, growth of GaN layers on compliant SOI substrates can allow the internal quantum efficiency IQE value of multi-quantum well material to be comparable to IQE values of equivalent structures formed on sapphire and SiC substrates. In example embodiments, the substrate compliance can be achieved by using very thin Si overlayer in SOI substrates that are less than about 100 nm and also by using patterned SIMOX SOI substrates/selectively formed underlying buried oxide platforms. In the example embodiments, a flat and crack-free film with a significantly lower bowing factor can be achieved. Furthermore, in the above described example embodiments, fabrication of vertical LED structures on high thermal conducting copper metal substrates can achieve highly efficient and high power LEDs.

In example embodiments using SIMOX SOI substrates, during MOCVD epitaxy, the growth temperature on the surface is modulated due to the presence of buried oxide layer in the SIMOX SOI substrates. Such SOI substrates allow a higher In incorporation during MOCVD epitaxy due to a change in the surface temperature and eventually, InGaN/GaN multi-quantum wells with high In content can be realized on top of the SIMOX SOI substrates. To modulate the In content laterally across a LED chip, periodic buried oxide can be created and thus, interference substrates can be created from patterned SIMOX SOI wafers. Thus, a broad band emission can be achieved and it has been possible to achieve phosphor white LEDs by using wavelength-dependent substrate reflectivity. Furthermore, when such LED structure layers are transferred to high thermal conductive substrates, a dichromatic or broad band LED emission can be achieved. This approach can be useful to bypass several layering of phosphors or light converting materials on LED chips.

In other words, micro-cavity based structures can be achieved by fabricating electroluminescent InGaN/GaN LED structures on very thin and large area SOI substrates prepared by separation by implantation of oxygen method (SIMOX). Due to the high refractive contrasts at the SOI interfaces, the multiple reflections of longer wavelength visible light leads to strong interference peaks in the electroluminescence (EL) spectrum and an increased EL intensity. This approach can allow phosphor-free white LEDs to be realised due to increased SOI substrate reflectivity at longer wavelengths. The GaN on SOI can be promising from the viewpoint of integration with other SOI-based microsystems, optoelectromechanical systems (MOEMS), and sensors. It is expected that such an LED technology can be ramped up to 12-inch production mode as SOI wafers can be prepared to up to 12 inches by customized implantation methods.

Thus, from the example embodiments, the inventors have confirmed that ion-implanted SIMOX SOI substrates are suitable for GaN epitaxy for large scale device fabrication.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of forming a vertical III-nitride based light emitting diode structure, the method comprising,
    forming a III-nitride based light emitting structure on a silicon-on-insulator (SOI) substrate;
    forming a metal-based electrode structure on the III-nitride based light emitting structure; and
    removing the SOI substrate by a layer transfer process such that the metal-based electrode structure functions as a metal-based substrate of the light emitting structure;
    wherein the method further comprises creating an inhomogeneous Group III metal content in the III-nitride based light emitting structure for modulating emission spectra of the light emitting diode structure by patterning a buried oxide layer of the SOI substrate.

2. The method as claimed in claim 1, wherein the step of removing the SOI substrate comprises mechanically removing substrate material, etching substrate material or both.

3. The method as claimed in claim 2, wherein the mechanically removing substrate material step comprises one or more of a group consisting of lapping, grinding and etching, wherein the mechanically removing substrate material removes SOI and Si handle material.

4. The method as claimed in claim 1, wherein the step of forming the III-nitride based light emitting structure comprises growing nitride epilayers on the SOI substrate using metal organic chemical vapor deposition (MOCVD).

5. The method as claimed in claim 1, further comprising forming a seed layer on the III-nitride based light emitting structure for facilitating the layer transfer process.

6. The method as claimed in claim 5, wherein the seed layer comprises nickel.

7. The method as claimed in claim 5, further comprising bonding the seed layer to the metal-based substrate using electroplating, electroless deposition or both.

8. The method as claimed in claim 1, wherein the patterning step comprises using a SiO2 mask to form the patterns on (111)-oriented silicon.

9. The method as claimed in claim 1, wherein the step of forming the III-nitride based light emitting structure further comprises forming a nitride-based buffer layer directly on the SOI substrate.

10. The method as claimed in claim 1, further comprising forming a reflective mirror layer on top of the III-nitride based light emitting structure, the mirror layer being capable of functioning as a p-type contact electrode, prior to the layer transfer process.

11. The method as claimed in claim 10, wherein the reflective mirror layer comprises a plurality of layers selected from a group of material consisting of nickel, gold, platinum, silver, palladium and ruthenium and the method further comprises subjecting the reflective mirror layer to thermal annealing in which the temperature ranges from about 400° C. to about 700° C.

12. The method as claimed in claim 1, further comprising selectively forming photonic crystal (PhC) structures on the III-nitride based light emitting structure after the step of removing the SOI substrate.

13. The method as claimed in claim 12, further comprising forming an n-type contact electrode structure on an n-doped III-nitride layer of the III-nitride based light emitting diode structure after the step of selectively forming photonic crystal (PhC) structures.

14. The method as claimed in claim 13, wherein the n-type contact electrode structure comprises a plurality of layers selected from a group of material consisting of titanium, aluminium, gold, chromium and nickel.

15. The method as claimed in claim 1, wherein the SOI substrate is prepared using a separation by implantation of oxygen (SIMOX) process to create Si overlayers which vary from about 10 nm to about 300 nm thick with a buried oxide or silicon dioxide thickness ranging from about 60 to about 400 nm.

16. The method as claimed in claim 1, wherein the SOI substrate comprises a (111)-oriented Si overlayer and a (111)-oriented Si handle.

17. The method as claimed in claim 1, wherein the step of creating an inhomogeneous Group III metal content in the III-nitride based light emitting structure comprises creating an inhomogeneous indium content in the III-nitride based light emitting structure for modulating emission spectra of the light emitting diode structure.

18. A method of forming a vertical III-nitride based light emitting diode structure, the method comprising,
    patterning a buried oxide layer of a silicon-on-insulator (SOI) substrate;
    forming a III-nitride based light emitting structure on the patterned SOI substrate;
    removing the patterned SOI substrate; and
    creating an inhomogeneous Group III metal content in the III-nitride based light emitting structure for modulating the emission spectra from the light emitting diode structure using the buried oxide layer patterned in the patterning step.

19. The method as claimed in claim 18, wherein the patterning step comprises using a $SiO_2$ mask to form the patterns during a separation by implantation of oxygen (SIMOX) process.

20. The method as claimed in claim 18, wherein the step of forming the III-nitride based light emitting structure further comprises forming a buffer layer directly on the patterned SOI substrate.

21. The method as claimed in claim 18, wherein the patterned SOI substrate comprises a (111)-oriented Si overlayer and a (111)-oriented Si handle.

22. The method as claimed in claim 18, wherein the SOI substrate is patterned with micron scale circular or hexagonal concentric type shapes to induce modulated emission spectra from the vertical III-nitride based light emitting diode structure.

23. The method as claimed in claim 18, wherein the SOI substrate is patterned using a separation by implantation of oxygen (SIMOX) process to create periodic Si overlayers which vary from about 10 nm to about 300 nm thick with a patterned buried oxide or silicon dioxide thickness ranging from about 60 to about 400 nm.

24. The method as claimed in claim 18, wherein the step of creating an inhomogeneous Group III metal content in the III-nitride based light emitting structure comprises creating an inhomogeneous indium content in the III-nitride based light emitting structure for modulating emission spectra of the light emitting diode structure.

* * * * *